United States Patent [19]

Ichihara et al.

[11] 4,302,408

[45] Nov. 24, 1981

[54] METHOD OF PRODUCING PYRO-ELECTRIC AND PIEZO-ELECTRIC ELEMENTS

[75] Inventors: Shoji Ichihara, Yokkaichi; Iwao Seo, Ibaragil, both of Japan

[73] Assignee: Mitsubishi Petrochemical Co., Ltd., Tokyo, Japan

[21] Appl. No.: 137,963

[22] Filed: Apr. 7, 1980

[30] Foreign Application Priority Data

Apr. 11, 1979 [JP] Japan .................................. 54/44515

[51] Int. Cl.³ .......................................... H01L 41/22
[52] U.S. Cl. ...................................... 264/22; 156/150; 156/229; 156/272; 427/12; 427/100
[58] Field of Search .................... 264/22; 427/100, 12; 156/229, 150, 272; 425/174.8 E; 428/421

[56] References Cited

U.S. PATENT DOCUMENTS

| | | | |
|---|---|---|---|
| 2,848,747 | 8/1958 | Dixon | 264/146 |
| 2,956,723 | 10/1960 | Tritsch | 229/48 |
| 3,223,761 | 12/1965 | Raley | |
| 3,322,870 | 5/1967 | Sacks | 264/514 |
| 3,943,614 | 3/1976 | Yoshikawa et al. | 264/22 |
| 3,970,862 | 7/1976 | Edelman et al. | 307/88 ET |
| 4,058,582 | 11/1977 | Bierenbaum et al. | 264/154 |
| 4,127,681 | 11/1978 | Ferren et al. | 264/22 |

FOREIGN PATENT DOCUMENTS

| | | | |
|---|---|---|---|
| 43-15715 | 7/1968 | Japan. | |
| 51-85499 | 7/1976 | Japan | 428/421 |

Primary Examiner—James B. Lowe
Attorney, Agent, or Firm—Donald D. Mon

[57] ABSTRACT

This invention relates to a method of manufacturing pyroelectricity and piezoelectricity elements consisting of a very thin film of polyvinylidene fluoride or a co-polymer of polyvinylidene fluoride less than 7 micron thickness which is stretched while in close contact with a laminating resin which has a low adherence to said film so that said film can be stretched very thin as stated above.

38 Claims, 2 Drawing Figures

METHOD OF PRODUCING PYRO-ELECTRIC AND PIEZO-ELECTRIC ELEMENTS

BACKGROUND OF THE INVENTION

The present invention relates to a method of manufacturing a pyroelectric or piezoelectric element consisting of a thin film of polyvinylidene fluoride of a vinylidene-fluoride copolymer (hereafter we refer to as PVDF).

Stretched PVDF having the β-Form crystal exhibits a large piezoelectricity and pyroelectricity useful for application in a piezoelectric element or pyroelectric element. Among their applications, a method of manufacturing a pyroelectric element or piezoelectric element from thin films of PVDF is widely desired because the thin film allows application of the device for an ultra sonic device; in the case of the piezoelectric devices to improve the sensitivity, response velocity, and to improve resolving power of the device in the case of the pyroelectric element.

Heretofore, the investigations of stretching of PVDF were limited chiefly to extruded films and partly to press molded films or films cast from a solution. However, the purpose of the investigations was to improve the piezoelectricity and pyroelectricity and investigation for providing thin PVDF films stretched in a high draw ratio was not performed. The reason for this is that the lower limit of the thickness of the extruded film having a uniform thickness is 10 to 20 micron. Further stretching of the thin extruded films in a high draw ratio is difficult because the orientation of the extruded films increases with decreasing thickness. On the other hand, it is necessary to provide a stretching ratio of more than 3 times and preferably more than 3.5 times for piezo and pyroelectricity.

From the reasons described above the thickness of the stretched PVDF film conventionally used was more than 10 micron. It is necessarily a highly technical procedure for manufacturing a stretched film having a thickness of less than 7 micron. Moreover, a very thin stretched PVDF film having thickness less than 7 micron especially less than 3 micron has a tendency to collect electric charges, therefore handling of the stretched film becomes very difficult.

For making piezoelectric or pyroelectric elements, it is necessary to attach an electrode to both surfaces of the stretched PVDF film, and add heat treatment and polarizing. Usually, the electrodes are formed by evaporation. In this process, defects might occur due to the small capacity of heat in the case of thin film. Moreover, the thin film might break or produce creases during the heat treatment or polarizing.

BRIEF SUMMARY OF THE INVENTION

Accordingly, it is an object of the present invention to provide a method of manufacturing pyroelectric and piezoelectric elements consisting of a thin polyvinylidene fluoride or vinylidene fluoride copolymer film having a thickness less than 7 microns. In the manufacturing process, a resin equal to or larger than that of the PVDF film is laminated to one or both faces of said film. This assembly is stretched in a uniaxial direction until the thickness of said PVDF film is less than 7 micron. An electrode and a backing are then attached to one face of said film, then the laminate is separated from the film and finally an electrode is attached to another face of said film.

DETAILED DESCRIPTION OF THE DRAWINGS

Figure 1:
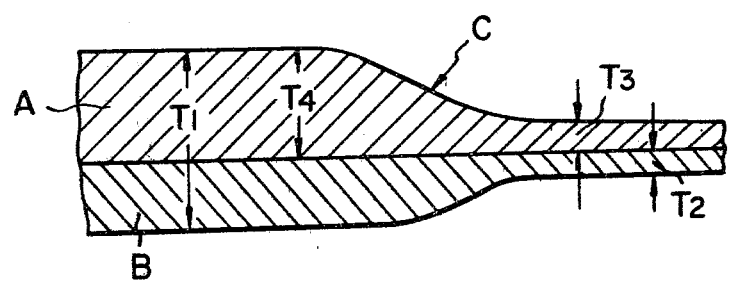
FIG. 1 shows a cross-sectional view of the stretching point according to one embodiment of the present invention.

Referring to the attached drawing, in FIG. 1, A is a homopolymer of vinylidenefluoride and copolymers of a vinylidenfluoride comprised of a vinylidene fluoride monomer of more than 70 mol% and another monomer which can polymerize with the vinylidene fluoride such as vinyle fluoride, trifluoroethylene, tetrafluoroethylene, fluorochlorovinylidene, trifluoro chloroethylene, hexafluoropropylene, (hereafter referred to generally as PVDF).

Layer B is a resin having a low adherence to said PVDF and the elongation of breaking point of resin B is equal to or more than the orientation ratio of PVDF (i.e. more than 3 times) at a stretching temperature which is selected between the temperature of 0° to 130° C. and preferably from 15° C. to 90° C. Whether the elongation of breaking point of the resin B is equal to or more than that of the PVDF or not, can be determined by comparing the elongation of breaking point that is measured with a sample configuration and stretching velocity shown and described in ASTM-D-880-67 at the stretching temperature of the PVDF selected between 0° to 130° C., with that of PVDF.

Then, the resin B selected in the manner described above, is laminated to the PVDF layer A by a close contact laminating method selected for that purpose to construct a laminated assembly as indicated at C having the necessary thickness. In said laminated assembly the resin B should be laminated on at least one face to the PVDF layer A, further, a multi-close laminated assembly may be employed. Generally, in a highly crystalline polymer, the stretching of a quenched sample is easier and more stable than that of a more slowly cooled one. PVDF is also the same. In the case of polyvinylidene fluoride it is preferable to cool it rapidly to under a temperature of 130° C. and preferably to under 100° C. Therefore, in the laminated assembly C, rapid cooling is possible because PVDF layer is very thin. For this reason, the stretching of the laminated assembly C is stable and the breaking point advantageously becomes large.

Any close contact laminating method may be employed. For example, dry laminating, inner die laminating, or a method in which a solution of a resin is cast on a film of another resin, then dried, may be employed. In the dry laminating, either one or both resins may be formed previously. In the case of casting from a solution, if one of the layers is formed by a method which involves casting from a solution, both of the layers may be formed by casting from a solution. For casting both layers from solution, one layer is cast first and the other layer is cast after, or both layers may be cast simultaneously. Further, the laminated assembly C thus obtained may be heat treated at an appropriate temperature, for example one or both of the resins are heated above their melting temperatures and then cooled.

In the laminated assembly obtained as above, when the PVDF layer A and resin layer B are separated at their boundary surface or as near as possible to the boundary surface and no roughness of the surface is observed at the separation, the resin B is considered to be low adherence resin against PVDF. Whether the resin B is of low adherence with PVDF or not, depends not only on the combination of resins but also the condition and method of close contact laminating. The resin layer B selected is thus a polymer for example, a polyolefin or polyolefin copolymer such as a high density polyethylene, polypropylene, polyamide, polyethylenetelephthalate, polyvinylchloride etc.

Then, the close contact laminated assembly, obtained as above, is stretched uniaxially as shown in FIG. 1, or biaxially. In the uniaxial stretching process the direction of tension hereinafter will be called the longitudinal direction. In the case of biaxially stretching, tension is applied in both the longitudinal direction and a transverse direction which crosses the longitudinal direction at a right angle. The thickness T3 of the PVDF layer in the laminated assembly C stretched at least uniaxially is less than 7 microns.

If standard lines of equal length are provided on the face of the film of laminated assembly C before stretching, the ratio in the longitudinal direction and transverse direction can be obtained from the following equation.

The draw ratio=length of a line before stretching relative to the length of a line after stretching.

The draw ratio in thickness can be obtained by following equation:

Draw ration = $T2/T1$

T1; thickness before stretching
T2; thickness after stretching

In the case of uniaxial stretching the draw ratio is defined as draw ratio in the longitudinal direction. In this case the draw ratio in the transverse direction is less than 1. If both the longitudinal or transverse draw ratio are more than 1 or equal to 1, the draw ratio is defined by the value of the: (draw ratio in longitudinal direction)×(draw ratio in transverse direction). The thickness of the PVDF layer and resin layer B before stretching can be determined by the following equation. (thickness of layer after stretching)×(draw ratio in longitudinal direction)×(draw ratio in transverse direction).

In the present invention, as previously explained it is necessary to produce a stretch ratio of at least 3 times so that the thickness T3 of the PVDF layer A after stretching is less than 7 micron, however there is no limitation of the thickness T4 of the PVDF layer A before stretching. However, the thickness T4 preferably should be equal to or smaller than a value calculated by the previous formula, and the thickness T3 of PVDF layer after stretching under the selected temperature, method and condition for this purpose is 7 micron. Preferably the thickness of the resin layer B is larger than half of the thickness of the PVDF layer A. It is also desirable that the thickness of the resin layer B after stretching is greater than 2 micron, and preferably more than 7 micron. After stretching, it is preferable that the thickness of the PVDF be less than 5 micron and the thickness of resin B is in the range of 10 to 30 microns.

Stretching temperature, stretching method, stretching rate and thickness of the PVDF layer A after stretching are selected according to the purpose of or intended use of the stretched PVDF film.

In a close contact laminated assembly C and a thickness of stretched PVDF of less than 7 micron, the elongation of breaking point increases for the PVDF only due to contacting, even if not adhered. This effect is observed in PVDF having a large substantial orientation in the unstretched state and its birefringence being greater than $5 \times 10^{-3}$ before stretching.

It is customary to apply a heat treatment to the stretched film because of its thermal instability. In the case of the stretched PVDF film, the heat treatment is especially important because the heat treatment increases not only the thermal stability, but also the piezoelectricity and pyroelectricity of the film. It has been discovered that, in the case of PVDF, it is preferable to perform the heat treatment at a temperature selected from the range of between the melting point and a temperature of 70 degrees C. lower than the melting point. Higher piezoelectricity and pyroelectricity can be obtained by performing the heat treatment near the melting point temperature and under a pressure which is near atmospheric pressure or more preferably a higher pressure in a liquid at a pressure of 300 to 3000 atm rather than a lower pressure. In this heat treatment process handling of a film of less than 7 micron thickness, especially less than 3 microns, becomes very difficult because the film has a tendency to produce creases due to non-uniform tension in film and partial melting.

It is a necessary step to attach electrodes or leads and some type of backing for constructing an electric element. In the present invention, the stretched close contact laminated assembly C comprised of the PVDF layer A and the resin layer B is kept in a contacted state but it may be easily separated because it is not adhered.

It is possible to attach an electrode and a backing on the face of the PVDF layer, then separate the resin layer B and attach an electrode on the other surface of PVDF and then anneal and polarize the PVDF film. However, it is also possible that the stretched close contact laminated assembly C may be thermally treated without separating the resin layer B, then electrodes may be attached to the PVDF as above and a lead wire and backing attached.

For attaching electrodes, metal foils or metal plates are adhered on both faces of the PVDF or a conductive paste is smeared, or metal such as aluminum is evaporated, sputtered or metal such as silver is plated chemically on the both faces of PVDF and, thus, conductive layers are formed at both surfaces of PVDF.

A backing is provided for the PVDF for reinforcing, shaping or adding tensile force. Polyethylene, polypropylene, polyvinylchloride, polyester or other plastic film, a rigid plastic film or aluminium, copper etc are used for the backing in the shape of a ring, rectangular etc, and the PVDF film is attached to them.

For polarizing the PVDF film with electrodes attached in said manner it is heated to a predetermined temperature, usually 40° C. to 130° C., then a direct electric field is applied or direct and alternating electric field for a predetermined interval and while being cooled slowly or rapidly.

The strength of the electric field for polarizing is generally in the range of 100 KV/cm to a voltage just above which a dielectric breakdown will occur and generally from 300 to 2500 KV/cm. Polarizing time is not defined but is preferably more than 30 minutes.

As explained above in the present invention a resin B having a low adherence to the PVDF film and having an equal or larger breaking point than that of the PVDF at a temperature selected from 0° C. to 130° C. for this purpose, is in close contact with the PVDF so as to be a laminated assembly and the laminated assembly is stretched so that the breaking point of PVDF increases beyond that of PVDF alone in the case of a PVDF thickness after stretching of less than 7 micron and a very thin PVDF stretched film can be obtained.

For utilizing the PVDF as an electric element, heat treatment, attaching electrodes and a lead wire, and polarizing are necessary after stretching. However these steps are difficult for a stretched PVDF film of a thickness less than 7 micron specially less than 3 micron because the film is very thin and has a tendency to collect electric charges. However, in the present invention, these steps are performed easily because a resin B is in contact with the PVDF even if not adhered, and the steps for attaching electrodes, lead wires and backing are performed on the laminated state to the thin film having a thickness less than 7 micron or especially less than 3 micron.

To further illustrate this invention, the following examples are given as exemplary but not by way of limitation.

EXAMPLE 1

The thickness of the polypropylene layer before stretching is approximately 30 micron. The thickness of polyvinylidene fluroide layers are 21, 15, 4, 2 micron respectively before stretching and they are laminated to the polypropylene layer by means of an inner die laminating method and five kinds of two layers in a close contact laminated assembly are formed. Part of said assemblies are split into pieces of 15 mm width. Further a portion of the split pieces has the polypropylene layer separated leaving only the polyvinylidene fluoride layer. These pieces are stretched by a tensile tester at a temperature of 23° C., a distance between chucks of 50 mm, a stretching rate of 50 mm/min, and a measured draw ratio of polyvinylidene fluoride at its breaking point and a thickness of polyvinylidene fluoride after stretching. Results are shown in table 1. In table 1, t is the thickness (in microns) of polyvinylidene fluoride, and B is the draw ratio at the breaking point, suffix D indicates a close contact laminated assembly, suffix S indicates a vinylidene fluoride layer only. The polypropylene layer is not included in the conditions shown in table 1.

It is understood from table 1 that there is no difference in the draw ratio at the breaking point between a close contact laminated assembly and a polyvinylidene fluroide layer only in the case of a 10 micron thickness stretched polyvinylidene fluoride however, there is a significant difference in the draw ratio at the breaking point between a close contact assembly and a polyvinylidene fluoride only in the case of a layer of less than a 7 micron thickness of stretched polyvinylidene fluoride with the difference increasing for a decreasing thickness of stretched polyvinylidene fluroide. In the case of more than a 10 micron thickness of stretched polyvinylidene fluoride, the draw ratio at the breaking point of PVDF in the assembly and a PVDF layer only will be the same considering their measuring error.

TABLE 1

| $t_d$ | $\lambda_D^B$ | $t_S$ | $\lambda_S^B$ | $\lambda_D^B/\lambda_S^B$ |
|---|---|---|---|---|
| 10 | 5.1 | 10 | 4.9 | 1.04 |
| 7 | 5.0 | 7 | 4.4 | 1.14 |
| 5 | 4.5 | 5 | 3.8 | 1.18 |
| 2 | 4.0 | 2 | 3.0 | 1.34 |
| 1 | 5.2 | 1 | 2.6 | 2.00 |

EXAMPLE 2

A 4 micron thickness of a polyvinylidene fluoride film is formed in an assembly as explained in example 1, and is made from a piece of 15 mm width, stretching under a condition of 50 mm distance between chucks, with a 50 mm/min stretching rate, and a measured stretching ratio at the breaking point for various temperatures. Results are shown in table 2. It is understood from this example that the stretching ratio at the breaking point of the assembly is $\lambda_D^B$ higher than that of the polyvinylidene fluoride layer $\lambda_S^B$ only for all stretching temperatures.

TABLE 2

| Temperature (C) | $t_D$ | $\lambda_D^B$ | $t_S$ | $\lambda_S^B$ | $\lambda_D^B/\lambda_S^B$ |
|---|---|---|---|---|---|
| 0 | 2 | 3.2 | 3 | 2.5 | 1.28 |
| 20 | 2 | 3.9 | 2 | 3.0 | 1.30 |
| 40 | 2 | 4.5 | 2 | 3.4 | 1.32 |
| 60 | 2 | 4.9 | 2 | 3.8 | 1.29 |
| 80 | 2 | 4.8 | 2 | 3.6 | 1.33 |
| 100 | 2 | 5.4 | 2 | 4.1 | 1.32 |
| 120 | 2 | 6.2 | 2 | 4.9 | 1.27 |

EXAMPLE 3

A polyvinylidene fluoride (1) and a copolymer (2) of vinylidene fluoride and tetrafluoroethylene are employed as the PVDF layer. Polyvinylchloride (3), 6-nylon (4), low density polyethyline (5) and polypropylene (6) are employed as the resin B. The same measurements as in Example 1 are performed for the close contact laminated assembly and the PVDF film only.

The thickness of the PVDF in the close contact laminated assembly is 10 micron, and the thickness of the resin B is approximately 30 micron. Layers (1) and (2) are cast from a dimethylformamide solution. Layers (1) and (4), and (1) and (5) are assembled by dry lamination while (2) and (6) are assembled by an inner die laminate.

The results are shown in table 3 and the same effect as with example 1 should be recognized.

TABLE 3

| PVDF | Resin B | Temperature | $t_D$ | $\lambda_S^B$ | $t_S$ | $\lambda_S^B$ | $\lambda_D^B/\lambda_S^B$ |
|---|---|---|---|---|---|---|---|
| (1) | (3) | 80° C. | 5 | 5.0 | 6 | 4.2 | 1.19 |
| (1) | (4) | 80° C. | 5 | 4.8 | 6 | 4.0 | 1.20 |
| (1) | (5) | 80° C. | 5 | 5.3 | 5 | 4.5 | 1.18 |
| (2) | (6) | 80° C. | 4 | 6.5 | 5 | 5.3 | 1.22 |

EXAMPLE 4

Films formed in the manner shown by Example 1, in which the thickness of the polyvinylidene fluoride is 5 micron and 10 micron respectively, are cut into pieces 120 mm in length and 120 mm width, and part of said pieces are separated to form a single layer of polyvinylidene fluoride. These pieces are stretched in biaxial directions by means of biaxial stretching instrument (made by Iwamoto Seisakusho) under 60° C. temperature a stretching rate (velocity) of 100 mm/min and a measured draw ratio at the breaking point.

Results are shown in table 4.

TABLE 4

|  | Thickness of layer | Stretch magnification at breaking point |
|---|---|---|
| assembly | 5 micron | 17.6(= 4.4 × 4.2) |
|  | 10 micron | 28.1(= 5.3 × 5.3) |
| single layer | 5 micron | 6.25(= 2.5 × 2.5) |
|  | 10 micron | 14.4(= 3.8 × 3.8) |

EXAMPLE 5

An unstretched close contact laminated two layer assembly formed in the same manner as in Example 1, in which the thickness of polyvinylidene fluoride is 5 micron is stretched 4.5 times in a uniaxial direction at 70° C. and forms an oriented film. The film is then stessed with about 1 Kg/mm² of tensile force at room temperature, is heated for 1 hour at 175° C. and then cooled to room temperature rapidly. Then, Ag is evaporated on the face of the polyvinylidene fluoride layer of the laminated assembly, the polypropylene layer is then separated from the laminated assembly, and the Ag is evaporated on the reverse face of said polyvinylidene fluoride layer. Then a direct electric field is applied to the polyvinylidene fluoride layer for one hour at 120° C. and the polyvinylidene fluoride layer of 2 micron thickness is electretized by rapid cooling. Then the piezoelectric constant d31 and the electro-mechanical-coupling factor k33 are measured.

For measuring the piezoelectric constant d31, a vibrational tensile force at 130 Hz is applied to the sample and the electric charges generated at the opposite surfaces of the sample is measured, d31 is determined from said charges, the tensile force and displacement of the sample.

For measuring the electro-mechanical-coupling factor k33, a high frequency signal (near 250 MHz) is applied to the sample in the direction of its thickness sweeping its frequency and electric impedance of the sample for the frequency to be measured and an antiresonance-resonance curve for frequency is determined so that k33 may be calculated.

The results are shown in TABLE 5.

TABLE 5

| Electric field (KV/cm) | d31 (CGSesu) | k33 (%) |
|---|---|---|
| 100 | 2.0 × 10$^{-7}$ | 5.3 |
| 300 | 4.3 × 10$^{-7}$ | 11.1 |
| 500 | 5.8 × 10$^{-7}$ | 16.5 |
| 800 | 7.2 × 10$^{-7}$ | 19.4 |
| 1000 | 9.5 × 10$^{-7}$ | 24.6 |
| 1200 | 12.4 × 10$^{-7}$ | 31.6 |

EXAMPLE 6

Two layers in a close contact laminated assembly are stretched in biaxial directions in the same manner as explained in Example 4 so that the thickness of the polyvinylidene fluoride is 0.8 micron. The biaxially stretched assembly is then heated for 2 hours at 180° C. under a stressed condition. Then it is cooled and Ag is evaporated on the face of the PVDF in the assembly and the face is then adhered to an aluminum plate. The polypropylene layer is then separated and Ag is also evaporated on the reverse face of the PVDF. A direct electric field is applied to the PVDF film for one hour at 120° C. and the PVDF is polarized and the pyroelectric constantly measured. The results are shown in table 6.

TABLE 6

| Electric field strength (KV/cm) | Pyro electric constant (nC/cm² . K) |
|---|---|
| 300 | 0.2 |
| 500 | 0.6 |
| 1000 | 1.2 |
| 1500 | 2.1 |
| 2000 | 3.8 |

EXAMPLE 7

Two layers of close contact laminated assemblies in which the thickness of polyvinylidene flouride layers are 21, 10, 4, 2 micron in unstretched state respectively, formed in the same manner as described in example 1. Two other close contact layer laminated assemblies in which the thickness of polyvinylidene fluoride layers are 10, 4, 2 micron respectively and the thickness of the polypropylene layer is approximately 30 micron in an unstretched state are formed in the manner in example 1 but the condition during processing is varied. Then these assemblies are stretched by a tensile tester at 60° C. with other conditions the same as in example 1. Then the elongation of the breaking point B is measured for the polyvinylidene fluoride layers only and the polyvinylidene fluoride layer in the assembly, respectively. Moreover monolayers of polyvinylidene fluoride of 30 to 100 microns in thickness are formed under different conditions and the stretching ratios at the breaking point are measured under the same conditions.

Figure 2:
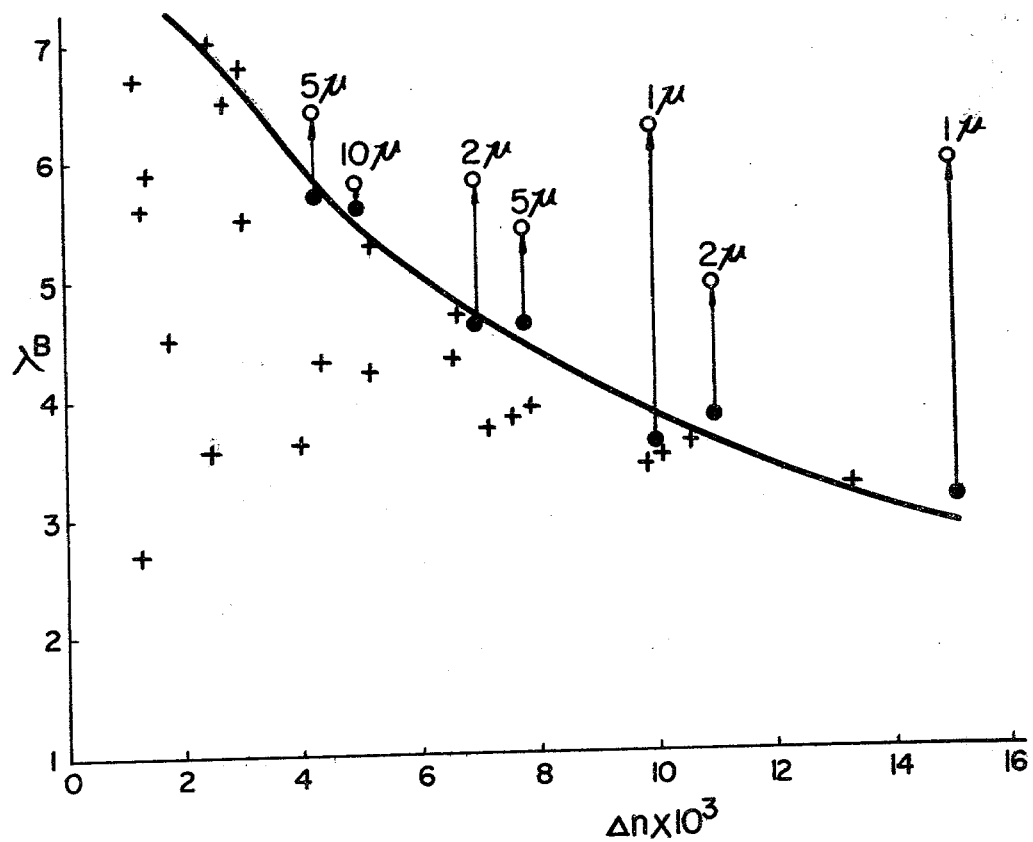
FIG. 2 shows a graph of strain at the breaking point vs. birefringence of the film before stretching of PVDF only and PVDF manufactured according to the present invention in various thicknesses.

The birefringence ratio of these samples in the unstretched state are measured. (In the case of the close contact laminated assembly, it is measured for the polyvinylidene fluoride layer only by separating the polypropylene layers). The relation between the birefringence ratio Δn and the draw ratio at the breaking point λ$^B$ is shown in FIG. 2. In FIG. 2, each + shows data for a monolayer of polyvinylidene fluoride film of thickness 30 to 100 micron. Each black dot in FIG. 2 shows the draw ratio at the breaking point and the birefringence ratio of the polyvinylidene fluoride layers only which are separated from the co-extruded assembly. The circles in FIG. 2 show data from a close contact laminated assembly with polypropylene corresponding to those of the monolayer PVDF films connected by an arrow. The numerals show the thickness the PVDF films after stretching.

From this result, it is apparent that with the present invention, a high draw ratio stretching is possible for thin polyvinylidene fluoride films even if the birefringence ratio of the unstretched polyvinylidene fluoride is high. In the case of a low birefringence ratio, not shown, the distribution of the draw ratio at the breaking point of a film in a close contact assembly is smaller than that of a film stretched in a single layer. In the case of a thin film, a stable, high draw ratio stretching with the present invention becomes possible.

This invention is not to be limited by the embodiments shown in the drawings and described in the description, which are given by way of example and not of limitation, but only in accordance with the appended claims.

We claim:

1. A method of manufacturing pyroelectric and piezoelectric elements in which at least one surface of a film of a polyvinylidene fluoride or copolymer of polyvinylidene fluoride is in close contact with a laminating resin having a breaking point for stretching equal to or greater than that of the polyvinylidene fluoride or copolymer of vinylidene fluoride and comprising a close contact laminated assembly, said close contact laminated assembly being stretched more than 3 times the thickness at least uniaxially at a temperature selected between 0° to 130° C. whereby the thickness of the stretched polyvinylidene fluoride or copolymer of polyvinydiene fluoride is less than 7 micron, and then polarizing said stretched film.

2. A method of manufacturing pyroelectric and piezo electric elements as claimed in claim 1, in which said stretching is performed uniaxially at least 3.5 times.

3. A method of manufacturing a pyroelectric and piezoelectric element as claimed in claim 1 in which said close contact laminated assembly is stretched in biaxial directions at a draw ratio greater than 13.

4. A method of manufacturing pyroelectric and piezoelectric elements as claimed in claim 1, in which said stretching is performed in the range of 15° to 90° C.

5. A method of manufacturing pyroelectric and piezoelectric elements as claimed in claim 1, in which the stretched polyvinylidene fluoride or copolymer of vinylydene fluoride is heat treated after stretched.

6. A method of manufacturing pyroelectric and piezoelectric elements as claimed in claim 1, in which a stretched film of polyvinylidene fluoride or copolymer of polyvinylidene fluoride is treated thermally at a temperature between their melting point and 70° C. below their melting point.

7. A method of manufacturing pyroelectric and piezoelectric elements as claimed in claim 6, in which the laminating resin has a melting point greater than the heat treating temperature.

8. A method of manufacturing pyroelectric and piezoelectric elements as claimed in claim 1 or 6, in which the laminating resin is a polypropylene or polyamide.

9. A method of manufacturing pyroelectric and piezoelectric elements as claimed in claim 1, in which said laminating resin is laminated at thickness such that the thickness after stretching is more than 2 micron.

10. A method of manufacturing pyroelectric and piezoelectric elements as claimed in claim 1, in which said laminating resin is laminated at a thickness such that the thickness after stretching is between 10 and 30 micron.

11. A method of manufacturing pyroelectric and piezoelectric elements in which at least one surface of a film of polyvinylidene fluoride of copolymer of vinylidene fluoride is in close contact with a laminating resin having breaking point for stretching equal to or greater than that of the polyvinylidene fluoride or copolymer of vinylidene fluoride and comprises a close contact laminated assembly, said close contact laminated assembly being stretched more than 3 times the thickness at least in a uniaxial direction at a temperature range of 0° to 130° C. so that the thickness of polyvinylidene fluoride or copolymer of vinylidene fluoride after stretching is less than 7 micron, including the steps of:
(a) heat treating the film at a temperature between the melting point (Tm) of polyvinylidene fluoride or copolymer of vinylidene fluoride and 70° C. lower than Tm;
(b) attaching an electrode on one face of the film of stretched polyvinylidene fluoride or copolymer of vinylidene fluoride; attaching a backing on the electrode, separating the laminated resin from the film; attaching an electrode on the other face of the polyvinylidene fluoride or copolymer of vinylidene flouride film and polarizing said film.

12. A method of manufacturing pyroelectric and piezoelectric elements as claimed in claim 11, in which step (a) is performed first, then step (b) is performed.

13. A method of manufacturing pyroelectric and piezoelectric elements as claimed in claim 11, in which step (b) is performed first, then step (a) is performed.

14. A method of manufacturing pyroelectric and piezoelectric elements as claimed in claim 11, in which the polarizing in step (b) and heat treatment of step (a) are performed simultaneously.

15. A method of manufacturing pyroelectric and piezoelectric elements as claimed in claim 11, 12 or 13 in which said stretching is performed in a uniaxial direction at a ratio of more than 3.5.

16. A method of manufacturing pyroelectric and piezoelectric elements as claimed in claim 11, 12 or 13 in which said stretching is performed in a biaxial directions at a stretch magnification greater than 13.

17. A method of manufacturing pyroelectric and piezoelectric elements as claimed in claim 11, 12 or 13 in which said stretching is performed at a temperature between 15° to 90° C.

18. A method of manufacturing pyroelectric and piezoelectric elements as claimed in claim 11, 12 or 13 in which the laminating resin has a melting point greater than the heat treating temperature.

19. A method of manufacturing pyroelectric and piezoelectric elements as claimed in claim 11, 12 or 13 in which said laminating resin is laminated at a thickness such that the thickness after stretching is greater than 2 microns.

20. A method of manufacturing pyroelectric and piezoelectric elements as claimed in claim 11, 12 or 13 in which said laminating resin is laminated at a thickness such that the thickness after stretching is between 10 and 30 microns.

21. A method of manufacturing pyroelectric or piezoelectric elements comprising laminating a film selected from the group consisting of a polyvinylidene fluoride or copolymer of polyvinylidene fluoride to a resin having a breaking point for stretching equal to or greater than said film; stretching said resin and said laminating film assembly at least in a uniaxial direction to a stretching ratio greater than 3 at a temperature range of approximately 0° to 130° C.; so that the thickness of said film is less than about 7 microns; and polarizing said stretched film.

22. The method according to claim 21 in which said stretching ratio is greater than about 3.5.

23. The method according to claim 21 in which said resin and said laminated film assembly is stretched biaxially at a draw ratio greater than 13.

24. The method according to claim 21 in which said stretching is performed in a temperature range of 15° to 90° C.

25. The method according to claim 21 including the step of heating said stretched film at a temperature between the melting point of said film and 70° C. below the melting point of said film.

26. The method according to claim 25 in which said resin has a melting point greater than said film.

27. The method according to claim 21 or 26 in which said resin is selected from the group consisting of polypropylene or polyamide.

28. The method according to claim 21 in which the thickness of the resin before stretching is selected to produce a thickness after stretching greater than 2 microns.

29. The method according to claim 1 in which the thickness of the resin before stretching is selected to produce a thickness after stretching of between 10 to 30 microns.

30. A method of manufacturing pyroelectric and piezoelectric elements comprising laminating a film selected from the group consisting of a polyvinylidene flouride or a compolymer of vinylidene fluoride to a resin having a breaking point for stretching equal to or greater than said film; stretching said resin and laminated assembly at a stretching ratio greater than 3 in at least a uniaxial direction at a temperature range between 0° and 130° C. so that the thickness of the film after stretching is less than 7 microns; heat treating the film at a temperature between its melting point and 70° below its melting point; attaching an electrode on one face of the stretched film; attaching a backing on said electrode; separating the resin from the film; attaching an electrode on the other face of the stretched film; and polarizing said film.

31. The method according to claim 30 in which said heat treating step is performed after said electrodes are attached.

32. The method according to claim 30 or 31 in which said heat treatment and polarizing steps are performed simultaneously.

33. The method according to claim 30 or 31 in which said stretching ratio is greater than about 3.5.

34. The method according to claim 30 or 31 in which said resin and laminated film assembly is stretched in biaxial directions at a stretch magnification greater than 13.

35. The method according to claim 30 or 31 in which said stretching is performed between a temperature range of about 15° to 90° C.

36. The method according to claim 30 or 31 in which said resin has a melting point greater than said film.

37. The method according to claim 30 or 31 in which the thickness of said resin is selected to produce a thickness after stretching of greater than 2 microns.

38. The method according to claim 30 or 31 in which the thickness of said resin is selected to produce a thickness after stretching of between 10 and 30 microns.

* * * * *